(12) United States Patent
Xie et al.

(10) Patent No.: US 10,957,471 B2
(45) Date of Patent: Mar. 23, 2021

(54) CALIBRATION SYSTEM AND CALIBRATING METHOD

(71) Applicants: Tyco Electronics (Shanghai) Co. Ltd., Shanghai (CN); TE Connectivity Corporation, Berwyn, PA (US); Kunshan League Automechanism Co., Ltd., Kunshan (CN)

(72) Inventors: Fengchun Xie, Shanghai (CN); Yingcong Deng, Shanghai (CN); Dandan Zhang, Shanghai (CN); Lvhai Hu, Shanghai (CN); Yun Liu, Shanghai (CN); Roberto Francisco-Yi Lu, Bellevue, WA (US); Haidong Wu, Kunshan (CN); Hui Xiao, Kunshan (CN)

(73) Assignees: Tyco Electronics (Shanghai) Co. Ltd., Shanghai (CN); TE Connectivity Corporation, Berwyn, PA (US); Kunshan League Automechanism Co., Ltd., Kunshan (CN)

( * ) Notice: Subject to any disclaimer, the term of this patent is extended or adjusted under 35 U.S.C. 154(b) by 21 days.

(21) Appl. No.: 16/232,484

(22) Filed: Dec. 26, 2018

(65) Prior Publication Data
US 2019/0198205 A1 Jun. 27, 2019

(30) Foreign Application Priority Data
Dec. 27, 2017 (CN) .......................... 201711444495.7

(51) Int. Cl.
*H01C 17/24* (2006.01)
*C23F 1/14* (2006.01)
(Continued)

(52) U.S. Cl.
CPC ............ *H01C 17/2416* (2013.01); *C23F 1/14* (2013.01); *G01R 31/013* (2013.01); *H01C 17/265* (2013.01); *C23F 1/08* (2013.01)

(58) Field of Classification Search
None
See application file for complete search history.

(56) References Cited

U.S. PATENT DOCUMENTS 6,750,416 B1 * 6/2004 Maierhofer .......... G01R 31/013
209/559
2017/0056931 A1 * 3/2017 Shen ........................ B07C 1/18
(Continued)

OTHER PUBLICATIONS

"Resistance and temperature relationship" found at www.basicsofelectricalengineering.com/2018/04/relationship-between-resistance-and.html. Article published Apr. 2018. (Year: 2018).*

*Primary Examiner* — Sylvia MacArthur
(74) *Attorney, Agent, or Firm* — Barley Snyder

(57) ABSTRACT

A calibration system adapted to calibrate a resistance of an electrical device having a lead wire comprises a resistance detector adapted to detect the resistance of the electrical device, a first container containing an etching solution adapted to etch the lead wire, and a heater configured to heat the electrical device. If a first resistance of the electrical device detected by the resistance detector at a first temperature is within a first predetermined range, the electrical device is heated with the heater to a second temperature higher than the first temperature. A second resistance of the electrical device is detected by the resistance detector at the second temperature. If the second resistance is beyond a second predetermined range, the lead wire is etched by the etching solution to adjust the resistance of the electrical device until the second resistance at the second temperature is within the second predetermined range.

20 Claims, 2 Drawing Sheets

(51) Int. Cl.
    *G01R 31/01*    (2020.01)
    *H01C 17/26*    (2006.01)
    *C23F 1/08*     (2006.01)

(56) References Cited

U.S. PATENT DOCUMENTS

2017/0057026 A1* 3/2017 Shen .................... B25J 15/0057
2018/0245176 A1* 8/2018 Li ........................... C22C 38/50
2019/0198205 A1* 6/2019 Xie ........................... C23F 1/14

* cited by examiner

CALIBRATION SYSTEM AND CALIBRATING METHOD

CROSS-REFERENCE TO RELATED APPLICATION

This application claims the benefit of the filing date under 35 U.S.C. § 119(a)-(d) of Chinese Patent Application No. 201711444495.7, filed on Dec. 27, 2017.

FIELD OF THE INVENTION

The present invention relates to a calibration system and, more particularly, to a calibration system adapted to calibrate a resistance of an electrical device.

BACKGROUND

A resistance of an electrical device is required to be within a predetermined range. Improved manufacturing precision is required to ensure that the resistance of the electrical device is within the predetermined range, which increases manufacturing difficulty and cost. If the resistance of the manufactured electrical device is not within the predetermined range, the electrical device is discarded, leading to increased manufacturing waste.

SUMMARY

A calibration system adapted to calibrate a resistance of an electrical device having a lead wire comprises a resistance detector adapted to detect the resistance of the electrical device, a first container containing an etching solution adapted to etch the lead wire, and a heater configured to heat the electrical device. If a first resistance of the electrical device detected by the resistance detector at a first temperature is within a first predetermined range, the electrical device is heated with the heater to a second temperature higher than the first temperature. A second resistance of the electrical device is detected by the resistance detector at the second temperature. If the second resistance is beyond a second predetermined range, the lead wire is etched by the etching solution to adjust the resistance of the electrical device until the second resistance at the second temperature is within the second predetermined range.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
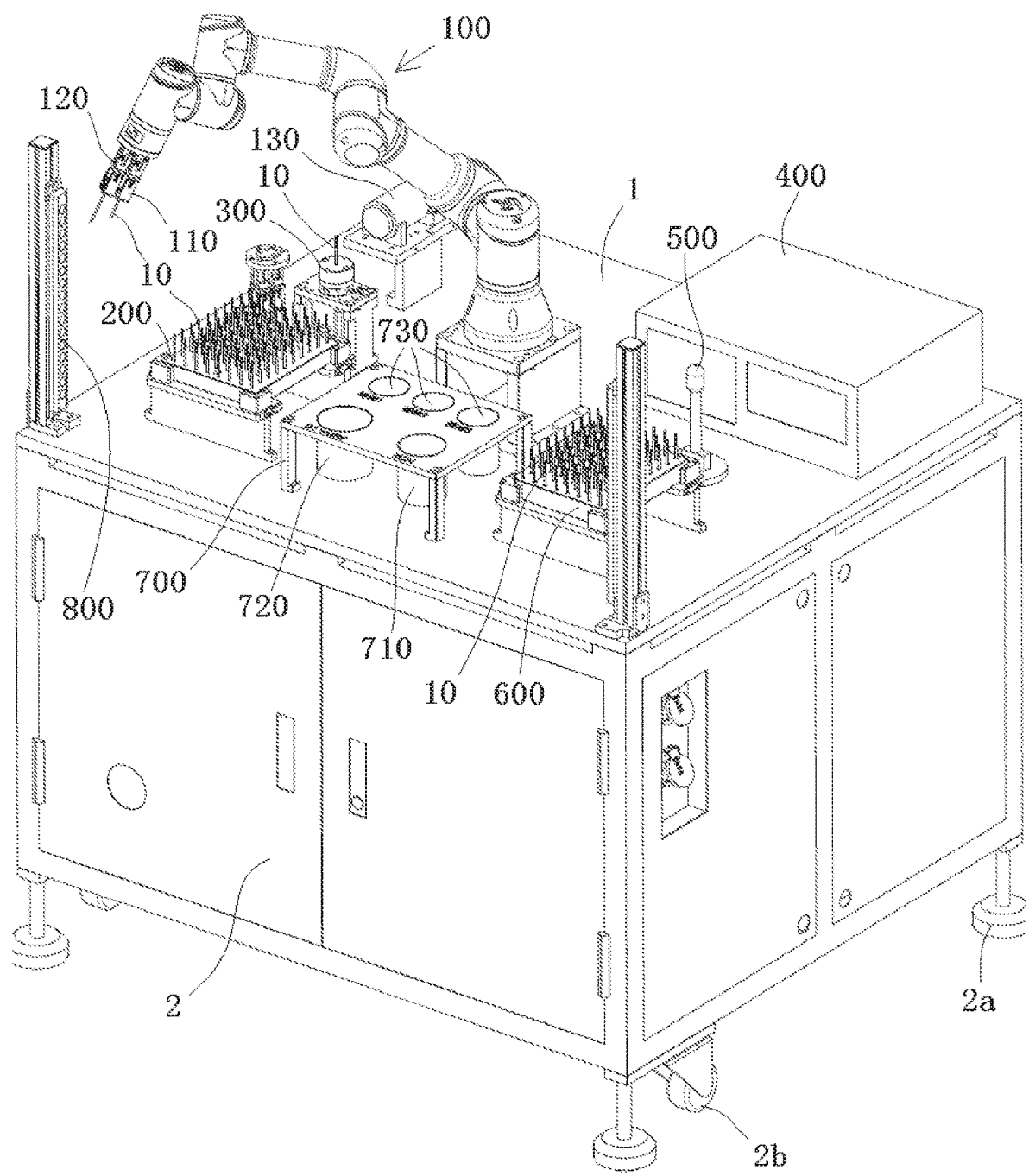
FIG. 1 is a perspective view of a calibration system according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
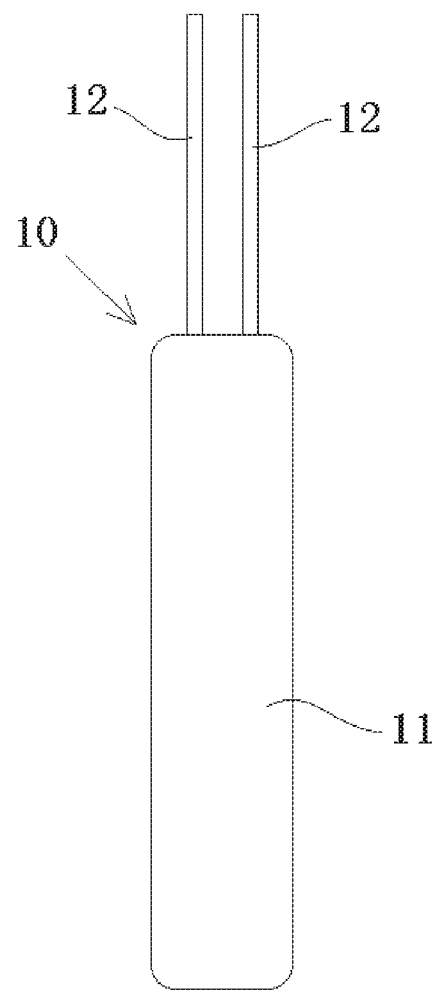
FIG. 2 is a top view of an electrical device according to an embodiment.

A calibration system adapted to calibrate a resistance of an electrical device 10, so that the resistance of the electrical device 10 meets a predetermined precision requirement, is shown in FIGS. 1 and 2.

As shown in FIG. 2, the electrical device 10 has a pair of lead wires 12 exposed outside of a body 11 of the electrical device 10. The electrical device 10 is adapted to be electrically connected to a circuit board by the lead wires 12. In an embodiment, the electrical device 10 is a sensor and the body 11 of the electrical device 10 is cylindrical.

The calibration system, as shown in FIG. 1, comprises a resistance detector 400, a first container 710, and a heater 500. The resistance detector 400 is adapted to detect the resistance of the electrical device 10. The first container 710 contains an etching solution suitable for etching the lead wire 12. The heater 500 is configured to heat the electrical device 10. In an embodiment, the heater 500 is a flame heater configured to heat the electrical device 10 with a flame, so that the electrical device 10 may be rapidly heated.

If a first resistance of the electrical device 10 at a first temperature detected by the resistance detector 400 is within a first predetermined range, the electrical device 10 is heated to a second temperature higher than the first temperature by the heater 500, and a second resistance of the electrical device 10 at a second temperature is detected by the resistance detector 400. If the detected second resistance is beyond a second predetermined range, the lead wire 12 is etched by the etching solution to adjust the resistance of the electrical device 10 until the second resistance of the electrical device 10 at the second temperature is within the second predetermined range. In an exemplary embodiment, the first temperature is a room temperature, that is, the temperature of the natural environment in which the calibration system is located; the first temperature is less than 40° C. in an embodiment. The second temperature is far above the first temperature and, in an embodiment, the second temperature is above 300° C.

The calibration system, as shown in FIG. 1, comprises a robot 100 having a first gripper 110 adapted to grip the lead wire 12 and a second gripper 120 adapted to grip the body 11 of the electrical device 10. The first gripper 110 is electrically connected to the resistance detector 400. When the first gripper 110 grips the lead wire 12, the electrical device 10 is electrically connected to the resistance detector 400 via the first gripper 110, so as to detect the resistance of the electrical device 10 by the resistance detector 400.

The calibration system, as shown in FIG. 1, comprises a first tray 200, a visual system 130, and a rotation table 300. A plurality of electrical devices 10 to be calibrated are placed on the first tray 200. The visual system 130 is adapted to guide the second gripper 120 to grip the body 11 of the electrical device 10 from the first tray 200. In an embodiment, the visual system 130 is a camera. The electrical device 10 to be gripped by the second gripper 120 is placed on the rotation table 300. The rotation table 300 rotates the electrical device 10 placed thereon to a predetermined position under the guidance of the visual system 130.

The calibration system, as shown in FIG. 1, comprises a second container 720 containing a deionized water for cleaning the electrical device 10. When the electrical device 10 placed on the rotation table 300 is rotated to the predetermined position, the robot 100, guided by the visual system 130, grips the lead wire 12 of the electrical device 10 by the first gripper 110 and places the gripped electrical device 10 in the second container 720 to clean it and remove impurities from it. After the electrical device 10 is cleaned by the deionized water, the robot 100 takes the gripped electrical device 10 out of the second container 720 and detects the first resistance of the electrical device 10 at the first temperature by the resistance detector 400.

The calibration system, as shown in FIG. 1, comprises a third container 730 containing a purified water for cleaning the electrical device 10. If the first resistance of the electrical device 10 at the first temperature detected by the resistance detector 400 is within the first predetermined range, the robot 100 puts the gripped electrical device 10 into the third container 730 to clean it. After the electrical device 10 is cleaned by the purified water, the robot 100 moves the gripped electrical device 10 to the heater 500 and heats the electrical device 10 to the second temperature by the heater 500. When the electrical device 10 is heated to the second temperature, the second resistance of the electrical device 10 at the second temperature is detected by the resistance detector 400. As shown in FIG. 1, the first container 710, the second container 720 and the third container 730 are mounted on a common support frame 700 of the calibration system.

If the detected second resistance at the second temperature is beyond the second predetermined range, the robot 100 places the gripped electrical device 10 into the first container 710 to etch the lead wire 12 of the electrical device 10. After the lead wire 12 of the electrical device 10 is etched, the robot 100 again places the gripped electrical device 10 into the third container 730 for cleaning and again detects the first resistance of the electrical device 10 at the first temperature by the resistance detector 400. If the detected first resistance of the electrical device 10 at the first temperature is within the first predetermined range, the robot 500 again moves the gripped electrical device 10 to the heater 500 and again heats the electrical device 10 to the second temperature by the heater 500. When the electrical device 10 is again heated to the second temperature, the second resistance of the electrical device 10 at the second temperature is again detected by the resistance detector 400.

The calibration system, as shown in FIG. 1, comprises a second tray 600 on which a plurality of calibrated electrical devices 10 are adapted to be placed. If the second resistance of the electrical device 10 at the second temperature detected by the resistance detector 400 is within the second predetermined range, the robot 100 places the gripped electrical device 10 on the second tray 600.

The calibration system, as shown in FIG. 1, comprises a security grating 800 located at an entrance of the calibration system to detect whether an external object enters into a working area of the calibration system. When the security grating 800 detects that the external object enters into the working area of the calibration system, the calibration system immediately stops working.

As shown in FIG. 1, the calibration system comprises a control cabinet 2 and a base 1 mounted on the control cabinet 2. The robot 100, the first tray 200, the rotation table 300, the resistance detector 400, the heater 500, the second tray 600, the support frame 700, the security grating 800, and the visual system 130 are mounted on the base 1. The control cabinet 2 has supporting feet 2a adapted to immovably support the control cabinet 2 on the ground and rollers 2b adapted to movably support the control cabinet 2 on the ground. The supporting feet 2a are foldable. When the supporting feet 2a are unfolded, the control cabinet 2 is immovably supported on the ground by the supporting feet 2a. When the supporting feet 2a are folded, the control cabinet 2 is movably supported on the ground by the rollers 2b.

A method for calibrating a resistance of the electrical device 10 comprises the steps of:
 detecting a first resistance of the electrical device 10 at a first temperature;
 heating the electrical device 10 to a second temperature higher than the first temperature and detecting a second resistance of the electrical device 10 at the second temperature if the detected first resistance is within a first predetermined range;
 etching an exposed lead wire 12 of the electrical device 10 to adjust the resistance of the electrical device 10 if the detected second resistance is beyond a second predetermined range; and
 repeating the detecting, heating, and etching steps until the second resistance of the electrical device 10 at the second temperature is within the second predetermined range.

In another embodiment, a method for calibrating a resistance of the electrical device 10 comprises the steps of:
 providing the calibration system;
 using the robot 100 to grip the electrical device 10 from the first tray 200 with the second gripper 120 and place the electrical device 10 on the rotation table 300;
 rotating the electrical device 10 on the rotation table 300 to the predetermined position under the guidance of the visual system 130;
 using the robot 100 to grip the electrical device 10 with the first gripper 110 and place the electrical device 10 into the second container 720;
 detecting the first resistance of the electrical device 10 at the first temperature with the resistance detector 400, and if the detected first resistance is within the first predetermined range, placing the electrical device 10 into the third container 730 using the robot 100;
 moving the electrical device 10 to the heater 500 using the robot 100 to heat the electrical device 10 to the second temperature higher than the first temperature;
 detecting the second resistance of the electrical device 10 at the second temperature with the resistance detector 400, and if the detected second resistance is beyond the second predetermined range, placing the electrical device 10 into the first container 710 using the robot 100 to etch the lead wire 12 of the electrical device 10 so as to adjust the resistance of the electrical device 10;
 repeating the detecting, moving, and detecting steps until the second resistance of the electrical device 10 at the second temperature is within the second predetermined range; and
 placing the calibrated electrical device 10 on the second tray 600 using the robot 100.

What is claimed is:
1. A calibration system adapted to calibrate a resistance of an electrical device having a lead wire, comprising:
 a resistance detector adapted to detect the resistance of the electrical device;
 a first container containing an etching solution adapted to etch the lead wire;
 a heater configured to heat the electrical device; and
 a robot adapted to grip the lead wire,
 wherein, with the electrical device at a first temperature, if a first resistance of the electrical device detected by the resistance detector is within a first predetermined range, the robot is adapted to:
heat the electrical device with the heater to a second temperature higher than the first temperature and detect a second resistance of the electrical device by the resistance detector; and
if the second resistance is beyond a second predetermined range, place the lead wire into the etching solution to etch the lead wire for adjusting the resistance of the electrical device.

2. The calibration system of claim 1, wherein the first temperature is less than 40° C. and the second temperature is above 300° C.

3. The calibration system of claim 1, wherein the robot includes a first gripper adapted to grip the lead wire, the first gripper is electrically connected to the resistance detector and, when the first gripper grips the lead wire, the electrical device is electrically connected to the resistance detector via the first gripper.

4. The calibration system of claim 3, further comprising:
a first tray on which a plurality of electrical devices to be calibrated are placed;
a second gripper of the robot adapted to grip a body of the electrical device; and
a visual system adapted to guide the second gripper to grip the electrical device from the first tray.

5. The calibration system of claim 4, further comprising a rotation table on which the electrical device is placed, the rotation table rotates the electrical device to a predetermined position under the guidance of the visual system.

6. The calibration system of claim 5, further comprising a second container containing a deionized water for cleaning the electrical device, and when the electrical device placed on the rotation table is rotated to the predetermined position, the robot grips the lead wire of the electrical device with the first gripper under guidance of the visual system and places the electrical device in the second container.

7. The calibration system of claim 6, wherein, after the electrical device is cleaned by the deionized water, the robot takes the electrical device out of the second container and detects the first resistance with the resistance detector.

8. The calibration system of claim 7, further comprising a third container containing a purified water for cleaning the electrical device, and if the first resistance is within the first predetermined range, the robot puts the electrical device into the third container.

9. The calibration system of claim 8, wherein, after the electrical device is cleaned by the purified water, the robot moves the electrical device to the heater and heats the electrical device to the second temperature, and when the electrical device is heated to the second temperature, the resistance detector detects the second resistance.

10. The calibration system of claim 9, wherein the robot places the electrical device into the first container to etch the lead wire if the second resistance is beyond the second predetermined range.

11. The calibration system of claim 10, wherein the robot places the electrical device into the third container and the resistance detector detects the first resistance at the first temperature after the lead wire is etched.

12. The calibration system of claim 11, further comprising a second tray, and if the second resistance is within the second predetermined range, the robot places the electrical device on the second tray.

13. The calibration system of claim 12, wherein the first container, the second container and the third container are mounted on a common support frame.

14. The calibration system of claim 13, further comprising a control cabinet and a base mounted on the control cabinet, the robot, the first tray, the rotation table, the resistance detector, the heater, the second tray, the support frame, and the visual system are mounted on the base.

15. The calibration system of claim 14, wherein the control cabinet has a plurality of supporting feet adapted to immovably support the control cabinet on the ground and a plurality of rollers adapted to movably support the control cabinet on the ground, the supporting feet are foldable, when the supporting feet are unfolded the control cabinet is immovably supported on the ground by the supporting feet, and when the supporting feet are folded the control cabinet is movably supported on the ground by the rollers.

16. The calibration system of claim 1, wherein the heater is a flame heater configured to heat the electrical device with a flame.

17. The calibration system of claim 1, wherein the electrical device is a sensor, a body of the electrical device is cylindrical, and the lead wire extends from the body.

18. A calibration system adapted to calibrate a resistance of an electrical device having a lead wire, comprising:
a resistance detector adapted to detect the resistance of the electrical device;
a first container containing an etching solution adapted to etch the lead wire;
a heater configured to heat the electrical device;
a robot adapted to grip the lead wire; and
a security grating located at an entrance of the calibration system and adapted to detect whether an external object enters into a working area of the calibration system, and when the security grating detects that the external object enters into the working area of the calibration system, the calibration system immediately stops working,
wherein, with the electrical device at a first temperature, if a first resistance of the electrical device detected by the resistance detector is within a first predetermined range, the robot is adapted to:
heat the electrical device with the heater to a second temperature higher than the first temperature and detect a second resistance of the electrical device with the resistance detector; and
if the second resistance is beyond a second predetermined range, place the lead wire into the etching solution to etch the lead wire for adjusting the resistance of the electrical device until the second resistance at the second temperature is within the second predetermined range.

19. A calibration system adapted to calibrate a resistance of an electrical device having a lead wire, comprising:
a resistance detector adapted to detect the resistance of the electrical device;
a first container containing an etching solution adapted to etch the lead wire;
a heater configured to heat the electrical device;
a robot having a first gripper adapted to grip the lead wire, the first gripper electrically connected to the resistance detector and, when the first gripper grips the lead wire, the electrical device is electrically connected to the resistance detector via the first gripper, the robot configured to:
with the electrical device at a first temperature, grip the electrical device with the first gripper to detect a first resistance of the electrical device with the resistance detector;

if the detected first resistance is within a first predetermined range, move the electrical device with the first gripper to the heater to heat the electrical device;

detect a second resistance of the heated electrical device with the resistance detector; and if the detected second resistance is beyond a second predetermined range, place the electrical device into the first container with the first gripper to etch the lead wire to adjust the resistance of the electrical device.

20. The calibration system of claim 19, further comprising:

a first tray on which a plurality of electrical devices to be calibrated are placed;

a rotation table on which the electrical device is placed, the rotation table rotates the electrical device to a predetermined position under the guidance of a visual system;

a second container containing a deionized water for cleaning the electrical device; and a third container containing a purified water for cleaning the electrical device, wherein the robot is further configured to:

when the electrical device placed on the rotation table is rotated to the predetermined position, grip the lead wire of the electrical device with the first gripper under guidance of the visual system and place the electrical device in the second container;

after the electrical device is cleaned by the deionized water, remove the electrical device from the second container and detect the first resistance with the resistance detector;

if the first resistance is within the first predetermined range, place the electrical device into the third container;

after the electrical device is cleaned by the purified water, move the electrical device to the heater for heating the electrical device; and detect the second resistance of the heated electrical device.

* * * * *